United States Patent
Riedel et al.

(10) Patent No.: US 6,221,813 B1
(45) Date of Patent: Apr. 24, 2001

(54) SHAPED BODIES COMPRISING TEXTURED SUPERCONDUCTING MATERIAL AND A PROCESS FOR THEIR PRODUCTION

(75) Inventors: Günther Riedel; Jürgen Neumann, both of Kelkheim; Joachim Bock, Erftstadt; Stephan Gauss, Sulzbach, all of (DE)

(73) Assignee: Aventis Research & Technologies GmbH & Co. KG, Frankfurt am Main (DE)

( * ) Notice: Subject to any disclaimer, the term of this patent is extended or adjusted under 35 U.S.C. 154(b) by 0 days.

(21) Appl. No.: 09/424,719
(22) PCT Filed: Feb. 9, 2000
(86) PCT No.: PCT/EP98/02660
§ 371 Date: Nov. 30, 1999
§ 102(e) Date: Nov. 30, 1999
(87) PCT Pub. No.: WO98/56048
PCT Pub. Date: Dec. 10, 1998

(30) Foreign Application Priority Data

Jun. 2, 1997 (DE) .............................. 197 22 779

(51) Int. Cl.[7] .............................. B28B 3/00; H01L 39/24
(52) U.S. Cl. .......................... 505/432; 505/491; 505/492
(58) Field of Search ..................................... 505/425, 432, 505/491, 492; 264/437; 419/23, 33, 42, 68; 174/125.1

(56) References Cited

U.S. PATENT DOCUMENTS

| | | | |
|---|---|---|---|
| 5,496,799 | * 3/1996 | Yoshida et al. | 505/450 |
| 5,594,932 | 1/1997 | Dupperay et al. | 419/29 |
| 6,043,198 | * 3/2000 | Neubacher et al. | 505/121 |
| 6,051,534 | * 4/2000 | Rayne et al. | 505/491 |

FOREIGN PATENT DOCUMENTS

| | | | |
|---|---|---|---|
| 427 209 | * 5/1991 | (EP) . | |
| WO 89/06053 | 6/1989 | (WO) . | |
| WO 96/21951 | 7/1996 | (WO) . | |

\* cited by examiner

*Primary Examiner*—Mark Kopec
(74) *Attorney, Agent, or Firm*—Frommer Lawrence & Haug LLP

(57) ABSTRACT

The invention relates to a process for producing a shaped body, in which a mixture of oxidic starting powders or a superconducting material, which comprises at least 30% by volume of platelet-shaped primary particles and has such a composition that a high-temperature superconducting material is formed on later, suitable thermal treatment, is comminuted by milling, shearing and/or rolling in such a way that the comminuted powder has a powder particle size distribution having a $d_{90}$ of $\leq 20$ $\mu$m, and in which the powders which have been comminuted in this way are isostatically compacted by the dry bag method.

21 Claims, 2 Drawing Sheets

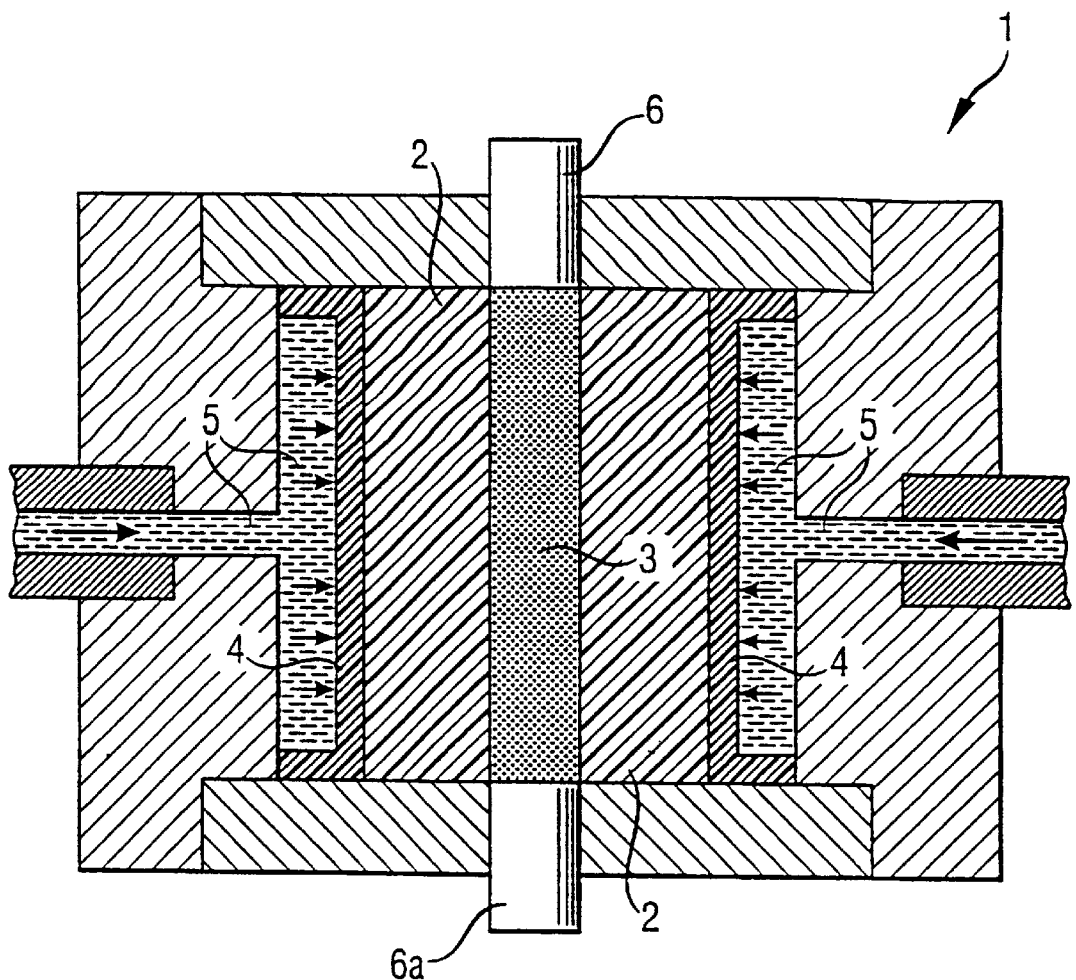

SHAPED BODIES COMPRISING TEXTURED SUPERCONDUCTING MATERIAL AND A PROCESS FOR THEIR PRODUCTION

The invention relates to a process for producing shaped bodies comprising textured superconducting material and the further processing of these shaped bodies to form massive high-temperature superconducting components such as power leads or high-temperature superconducting strips and wires by the oxide-powder-in-tube (OPIT) method.

Owing to the still too low current-carrying capacity of many high-temperature superconducting components, their use is limited. Further development of such components is necessary so that higher superconduction currents can flow through these components. To produce high-temperature superconductors having a high current-carrying capacity, it is necessary to optimize the high-temperature superconducting material in respect of purity, phase purity, phase composition, degree of crystallization and orientation.

The shaping of longitudinal bodies is customarily carried out using cold isostatic pressing (CIP) by the wet bag CIP method in which the pressing forces act on all sides of the shaped bodies, so that only weak or nonuniform alignment of the particles occurs.

In the wet bag method, a thin-walled, flexible rubber or plastic mold is filled with powder and, after being closed, introduced into a pressure vessel. Compaction to form shaped bodies is achieved by means of a liquid pressure transfer medium at a predetermined pressure. Tight dimensional tolerances as are required, in particular, for introduction of the shaped bodies into silver sheathing tubes in the OPIT method cannot be achieved in this way, so that further shaping, e.g. by turning the shaped bodies on a lathe, is necessary. This additional step increases the complication of the process and increases costs and also entails the risk of increasing the residual carbon content in the product, particularly in the case of small particle sizes, as a result of interaction with the $CO_2$ in the surrounding atmosphere during mechanical forming. However, it is especially small particles sizes which are desirable for the OPIT method.

Since pressure is applied on all sides in the wet bag method, uniform pretexturing of the platelet-shaped particles cannot be achieved. Following shaping, attempts are made to compensate for the nonuniform pretexturing by means of the mechanical treatment steps, e.g. extruding and/or rolling in the case of strip and wire production. This causes many flaws, cracks and fractures in and between the inorganic powder particles. These lead to comparatively low current densities or require long annealing times to heal these defects because unimpaired current flow can occur only in the case of oriented, directly adjoining defect-free grains of the high-temperature superconducting phase.

In uniaxial pressing of longitudinal shaped bodies, e.g. in a hydraulic press, the platelet-shaped powder particles are essentially aligned perpendicular to the pressing direction and thus perpendicular to the longitudinal direction of the shaped body. The texture is rotated precisely by 90° from the optimum alignment and has a particularly adverse effect on the current flow. When the texture is aligned optimally, the crystallographic (a,b) plane which is oriented parallel to the plane of the platelets and to the plane of maximum current-carrying capacity is in the direction of the current flow in the component. During the thermal treatments following shaping, the preferred orientation is essentially retained.

When metal tubes are filled manually with oxidic powders and when compaction is achieved by ramming rather than mechanical pressing, not only the increased effort but also the inhomogeneity of the pressed density and the low density of the shaped body are particularly disadvantageous. This leads to low superconducting contents in the component and to particularly low current carrying capacities.

EP-A-0 611 737 reports a process for producing superconductors based on (Pb,Bi)—(Sr,Ca)—Cu—O, in which an oxidic melt is first produced and quenched and the solid obtained is particularly finely comminuted. EP-A-0 396 581 describes a process for producing wires or strips of superconducting materials, in which process the compaction of the oxidic powder is carried out by wet bag cold isostatic pressing. WO-94/00886 likewise discloses a process in which isostatic compaction is achieved by the wet bag method.

WO-96/21951 teaches a process for producing an elongated superconducting body either by extrudation or by two successive isostatic compaction steps between which a heat treatment step is carried out or by a combination of first an extrusion procedure and two successive isostatic compaction steps between which a heat treatment step is carried out.

Further significant disadvantages of the high-temperature superconducting shaped bodies of the prior art are that the shaped bodies pressed by the wet bag method do not have a sufficiently accurate shape, that this method of shaping is particularly labor intensive and time consuming and that the process cannot be automated.

Saleable shaped blanks for further processing to produce massive high-temperature superconducting components such as power leads or to produce high-temperature superconducting strip or wire therefore have to have properties which can be transferred to the product by the user by means of comparatively few and/or short energy-saving thermal and/or mechanical treatments. In addition, the objective of the optimization of these blanks has to be to make the entire production process up to the finished products as simple and inexpensive as possible while also achieving improved product properties.

It is an object of the invention to provide a process for producing a superconducting material, by means of which an improved texture can be generated in a simple manner so that the heat-treated shaped bodies which can be produced by the process have fewer defects which impair the electrical properties and also have homogeneous compaction, a high density and a higher current-carrying capacity. A further object is to propose a method which is economical to carry out and can be used for an industrial process. In particular, it is an object to provide blanks in the form of un-heat-treated or heat-treated shaped bodies such that their subsequent further processing to produce massive high-temperature superconducting components such as power leads or to produce high-temperature superconducting strips and wires can be carried out particularly simply, quickly and with low energy consumption compared to the prior art.

These objects are achieved by a process for producing a shaped body, in which a mixture of oxidic starting powders or a superconducting material, which comprises at least 30% by volume of platelet-shaped primary particles and has such a composition that a high-temperature superconducting material is formed on later, suitable thermal treatment, is comminuted by milling, shearing and/or rolling in such a way that the comminuted power has a powder particle size distribution having a $d_{90}$ of $\leq 20$ $\mu$m, and in which the powders which have been comminuted in this way are isostatically compacted by the dry bag method.

For the purposes of the present invention, a shaped body is a body which has been shaped and can have been compacted according to the invention and may have been treated by means of further process steps such as heat treatment. This shaped body can accordingly consist essentially of a mixture of oxidic starting powders, of a superconducting material or of a heat-treated high-temperature superconducting material. The term shaped body is therefore retained in various stages of the production procedure.

The starting material can be a mixture of oxidic starting powders or a superconducting material. If organic salts such as a mixture of a plurality of oxalates or if a mixture of inorganic compounds such as carbonates or/and sulfates are used as starting material, it is necessary to calcine these first before use in the process of the invention, since calcination liberates very large amounts of gas which could destroy a pressed body on heating. During calcination of such starting materials, usually at temperatures in the range from 150 to 700° C., the nonoxidic compounds are converted into individual oxides and/or multiple oxides. On the other hand, the starting material used can also be a material which is already superconducting and can have been produced by heat treatment, melting or/and comminution and often does not yet have any, or not a high proportion of, high-temperature superconducting phases.

Even during calcination, the first low or/and high-temperature superconducting phases can sometimes be formed, e.g. the low temperature superconducting single-layered phase $Bi_2Sr_2Cu_1O_x$. In general, the high-temperature superconducting two-layered phase $Bi_2Sr_2Ca_1Cu_2O_{x'}$ is formed from this single-layered phase only on heat treatment at higher temperatures or/and for longer periods, e.g. in the temperature range from 700 to 830° C. Finally, significantly longer heat treatment forms the high-temperature superconducting three-layered phase $Bi_2Sr_2Ca_2Cu_3O_{x''}$ which can be converted into high-current-carrying, well crystallized, virtually phase-pure material only over long heat treatment times of usually more than 50 hours or even more than 100 hours in the temperature range of usually from 820 to 850° C. Apart from these superconducting phases, a plurality of non-superconducting phases such as alkaline earth metal cuprates and copper oxide are usually produced. However, the phase sequence indicated here is more complicated and is very dependent on the composition and its changes during the process and also on the process parameters. As regards the heat treatment of the powders and shaped bodies and also the repeated heat treatment and the overall temperature curve and also the further process steps such as comminution of the superconducting material and/or rolling of the multifilament, there are many possible variations. The objective of the process procedure has to be to achieve as high as possible a proportion of high-temperature superconducting phases, if possible a phase purity of ≧90% by volume, preferably ≧95% by volume or particularly preferably almost 100% by volume, of high-temperature superconducting phases. A further objective of the process has to be to produce a texture, a grain structure and individual grains such that as high as possible a current-carrying capacity is achieved.

The starting powder mixture or the superconducting material which is used according to the invention has to have such a composition that a high-temperature superconducting material is formed on later suitable thermal treatment. The formation of this heat-treated high-temperature superconducting material can be carried out by means of one or more heat treatment steps, preferably at the end of the manufacture of massive components such as power leads, or by means of one or more heat treatment steps in combination with, for example, the rolling of the shaped body introduced into one or more metal tubes, preferably at the end of wire manufacture by the OPIT method. The starting powder and the superconducting materials which can be used for the process of the invention are known in principle. Preference is given to those which, if desired in a mixture, have a mean particle size in the range from 1 to 20 µm, in particular from 1.5 to 15 µm, particularly preferably from 2 to 10 µm, measured using a laser granulometer Master Sizer from Malvern Instruments after ultrasound dispersion. The starting powders and the superconducting materials are advantageously of high purity, with the sum of the metallic impurities being ≦1000 ppm, particularly preferably ≦500 ppm. Their carbon content is preferably ≦500 ppm, in particular ≦300 ppm, since this avoids bubble formation, for example in a wire. Bubbles have a strong adverse effect on the current-carrying capacity and the mechanical properties of the wire.

The starting powder mixture or the superconducting material which is used at the beginning of the process of the invention should comprise at least 30% by volume, in particular at least 50% by volume, particularly preferably at least 70% by volume, of platelet-shaped primary particles. The term primary particles is used to describe the smallest individual particles, e.g. platelet-shaped particles, which can be achieved on appropriate comminution. It has been observed in initial experiments that the proportion of the high-temperature superconducting phase(s) is generally higher, the higher the content of platelet-shaped primary particles. The starting powder mixtures and the superconducting materials which may have been specifically comminuted usually contain a high proportion of particles consisting of partially sintered, hard aggregates as well as relatively easily separable agglomerates. The aggregates and agglomerates often consist essentially of platelet-shaped primary particles which are joined together strongly in the case of the aggregates and comparatively weakly in the case of the agglomerates (FIG. 1). The proportion of particles in the form of separate platelet-shaped primary particles is generally low.

On comminution of the particles to a powder particle size distribution having a $d_{90}$ of ≦20 µm, the aggregates are largely destroyed, the agglomerates are very largely divided and, in the case of exceptionally harsh comminution, many platelet-shaped primary particles are also broken up. The starting powder mixture or/and the superconducting material is advantageously comminuted in such a way that at most 90% by volume, in particular at most 70% by volume, more preferably at most 50% by volume, but particularly preferably at least 10% by volume and even more preferably at least 25% by volume, of the powder particles are present in platelet form for shaping. On comminution, the powders are preferably milled down to an agglomerate particle size in which no or virtually no undestroyed, hard aggregates >15 µm and if possible also no or virtually no comparatively readily destroyable agglomerates >25 µm still occur. The optimum comminution according to the invention comprises separation of the primary particles on division of the aggregates and agglomerates without the platelet-shaped primary particles being milled to a great extent. The proportions of the platelet-shaped primary particles recognizable under a scanning electron microscope often decrease significantly on milling, shearing or/and rolling. If, on the other hand, the starting powder mixture or the superconducting material is treated thermally before or/and after comminution, the proportion of plateletshaped primary particles generally increases, e.g. to at least 40% by volume, in particular to at least 60% by volume, especially to at least 75% by volume, on heat treatment at from about 600 to 800° C. for preferably from 2 to 10 hours in an oxygen-containing atmosphere.

Particularly if the platelet-shaped primary particles have been broken up too much during comminution, it is advisable to carry out this heat treatment in order to restore the platelet shape of the primary particles by crystal growth. However, should this heat treatment have too great an effect and lead to somewhat strongly sintered powders, light milling is necessary, e.g. in a vibration mill for about 15 minutes. It is advisable to monitor this process by means of examination under a scanning electron microscope.

The comminution of the starting powder mixture or the superconducting material by milling, shearing or/and rolling is preferably carried out using a vibration mill, a jet mill or/and shearing rollers. Here, dry milling with an organic liquid content of up to 0.5% by weight is preferred to wet milling in organic solvents. Preferably, only organic milling auxiliaries are added to the starting powder mixture or the superconducting material. These auxiliaries can, on the one hand, be useful as milling aids during comminution but, on the other hand, can also serve to produce free-flowing granular materials or/and readily pressable shaped bodies. When polymeric liquids such as surfactants are used, preference is given to adding amounts of up to 0.5% by weight.

Vibration milling preferably takes from 20 to 80 minutes, in particular from 30 to 60 minutes, at an amplitude of preferably from 3 to 6 mm, in particular from 4 to 5 mm, when using milling media made of, for example, zirconium oxide ceramic and a degree of fill with milling media of from 40 to 80%, preferably from 55 to 65%, and an amount of material being milled which preferably corresponds approximately to the interstitial volume between the milling media.

Jet milling can be carried out in a spiral jet mill using a powder feed rate of, for example, 500 g/h in one pass through the mill. The use of shear rollers is particularly well suited to delaminating fine particles which comprise platelet-shaped primary particles or can be readily cleaved.

Use of the preferred comminution equipment enables contamination of the milled product by abraded material from the milling media to be largely avoided when using plastic-lined milling vessels and as a result of the formation of a layer of material being milled on the surface of the milling media. Milling in an inert atmosphere such as technical-grade nitrogen makes it possible to limit the increase in the carbon content of the material being milled to contributions of about 50 ppm in the case of vibration milling and to contributions of from 50 to 100 ppm in the case of a jet mill. Surfactants as milling aids can surprisingly contribute the formation of a free-flowing granular material without spray drying or another granulation technique having to be employed. Free-flowing granular materials are preferable for automatic filling, but contents of polymeric liquids or/and other organic auxiliaries should preferably be removed immediately after pressing or before introduction of the pressed shaped body into a tube. At the latest before introduction of a shaped body into a metal tube, preferably immediately after pressing, the organic auxiliaries should be removed by baking out, burning out or chemical desorption.

The shaped bodies preferably have an essentially elongated, cylindrical, prismatic or tube-shaped geometry, but can also have an essentially isometric, ring-shaped, disk-shaped or other geometry. The pressed shaped bodies can be solid bodies or hollow bodies. It is preferable for the ratio of length to wall thickness of the shaped body at the time of shaping to be at least 2:1, preferably at least 4:1, particularly preferably at least 6:1, very particularly preferably at least 8:1. The length of the shaped bodies which are made from the pressed shaped bodies and are processed further according to the invention and the end products produced therefrom can be reduced in size, for example by dividing for a plurality of individual components or by machining off of ends, so that the ratio of the length to wall thickness which is preferably adhered to during shaping does not have to be maintained in respect of the component geometry. The shaped bodies are, in particular, blanks for the manufacture of wires, strips, rods, tubes or hollow or solid bodies which can be used, in particular, for the production of and use as high current cables, transformers, windings, magnets, magnetic bearings or power leads. It is advisable to optimize the shaped bodies so that they can be processed in a comparatively simple subsequent production process to give the desired high-temperature superconducting components. These subsequent process steps include, in particular, one or more firings in which the previously textured powder particles keep a strong texture during sintering.

In isostatic pressing by the dry bag method, preference is given to using a pressing pressure of from 400 to 5000 bar, in particular from 1500 to 3000 bar, particularly preferably from 1800 to 2500 bar, in order to effect the compaction and texturing of the powder. If the comminuted powder, in particular a granular material, is sufficiently free-flowing, it is possible to employ automatic powder metering, an automatic pressing cycle and automatic removal of the compact so that a shaped body or, in the case of a multiple tool, also a correspondingly higher number of shaped bodies is obtained in a very short time (about 2 minutes cycle time), which corresponds to about one tenth of the time for the wet bag method.

FIG. 2 shows, by way of example, a schematic diagram of a tool block (1) of an isostatic press using the dry bag method with bag (2) and the charge of material to be pressed (3). The pressing mold (4) in the dry bag method generally has a significantly thicker wall than in the wet bag method and has a higher hardness, e.g. Shore A in the range from 80 to 90. For example, it is possible to use a polyurethane bag which has a thickness of about 30 mm and has high shape stability in the pressureless state, good elasticity when pressure is applied, good recovery properties on release of the pressure and good shape stability in long-term operation. In this way, improved dimensional accuracy and trueness of shape are achieved. The bag (2) is installed in a tool block (1) and is subjected only radially to hydrostatic pressure via an elastic separating membrane (4) by means of a pressure transfer medium (5), e.g. one based on water. The construction of the press almost completely prevents non-radial pressing force components, since the closing punches (6, 6a) themselves transmit virtually no force but only act counter to the force component acting from the inside outward. The effect of this on the pressed shaped bodies is to introduce the desired texture. Owing to the construction of the press and the properties of the bag, tight shape and positional tolerances can be maintained. The entire cycle of filling, closing, pressurization and depressurization, opening and removal of the shaped body can be carried out fully automatically.

When pressing hollow bodies, it is possible to arrange, for example, a metal core preferably centrically in the hollow space of the bag. The shaped body pressed onto the core can easily be removed from the bag owing to the elastic recovery of the oxidic material if the nature of the composition is suitable or/and if conical cores are employed.

The desired texture is obtained if no or virtually no intact hard aggregates >15 $\mu$m are present in the material being pressed. The agglomerates have, as a rule, been broken down during pressing but may be further divided in a subsequent mechanical processing step. The texture is, for example in the case of suitable powders based on (Bi,Pb)—(Sr,Ca)—Cu—O, such that the texture does not change significantly from the edge to the middle of, for example, 10 mm thick shaped bodies under a scanning electron microscope and is comparatively strongly aligned in the axial direction of the shaped body. Heat treatment does not have an adverse effect on the texture of the shaped bodies.

It has surprisingly been found that the combination of a comminution in which the hard aggregates are largely destroyed and the platelet-shaped primary particles are not broken up very much with isostatic shaping by the dry bag method using virtually completely radial force transmission makes it possible to produce well pretextured shaped bodies which significantly reduce the expense of further processing, in particular further mechanical shaping or/and long heat treatment.

Particularly in the production of superconducting strips and wires, at least one elongated metal body is preferably embedded in the shaped body during shaping. The or every elongated metal body can be embedded as a core in the longitudinal direction in the region of the longitudinal axis or around the longitudinal axis of the shaped body. The elongated metal body can be, inter alia, a rod, wire or filament and can contribute to a higher current density in the product as a result of boundary layer effects between superconducting ceramic and metal. Particularly in the production of superconducting strips and wires, the or every shaped body is preferably inserted into a tube having an essentially cylindrical or prismatic shape, in particular a preferably metallic tube closed at one end. The or every elongated body or/and the tube consists essentially of at least one metal or at least one alloy and preferably comprises silver.

The shaped body has good ductility in the production of monofilament and multifilament strips or wires by the powder-in-tube method for producing high-current conductors for electrical engineering. The blank can be finished after pressing the shaped body or after heat treatment of the pressed shaped body. The blank can be further processed by single or repeated extrusion or/and rolling to produce a monofilament and, if desired, by bundling together a plurality of monofilaments and possibly additionally by single or repeated extrusion or/and rolling to produce a multifilament. Particularly in the production of superconducting strips and wires, the shaped body, the tube filled with the shaped body/bodies or the further processed shaped body is alternately heat-treated and rolled a number of times. These process steps are known in principle. During these steps, an even better texture of the blank, for example located in a silver sheath, should be achieved. Advantageously, heat treatments are carried out between the last rolling steps, which heat treatments are, for example in the case of materials based on (Bi,Pb)—(Sr,Ca)—Cu—O with or without a lead content, to effect the virtually complete formation of the superconducting phase BSCCO 2223 and the healing of the structural defects in the platelet-shaped primary particles introduced during extrusion/rolling. The compaction, the degree of texturing, the frequency of defects and the phase composition and distribution of the superconducting phase(s) are decisive influencing factors on the current-carrying capacity of the superconducting materials and on the currents to be carried by the components. The strips and wires produced in this way have a considerably higher proportion of high-temperature superconducting material in relation to the proportion of metal(s). The sheathing factor as ratio of the proportion of ceramic to the total cross section of the strip or wire is thus considerably increased, like the current-carrying capacity.

It is necessary for the shaped body, the tube filled with the shaped body/bodies or the further processed shaped body to be heat-treated at temperatures of from 400 to 900° C., in particular from 500 to 850° C., and in the case of materials based on (Y,RE)—Ae—Cu—O even in the range from 400 to 1100° C., preferably from 600 to 1050° C. Here, Ae designates alkaline earth elements. In the case of indications of the substitution of elements, all types of elements shown in brackets do not always have to be present. To produce massive components based on (Bi,Pb)—Ae—Cu—O, heat treatment at, for example, from 800 to 850° C. for from 10 to 150 hours, preferably for from 20 to 100 hours, in particular for from 30 to 60 hours, in an oxygen-containing atmosphere is necessary. It is advisable for the atmosphere to consist essentially of a mixture of nitrogen and oxygen containing from 0.1 to 50% by volume, in particular from 1 to 30% by volume, particularly preferably from 10 to 25% by volume, of oxygen. Preference is given to working in a stream of gas. The heat-treated shaped body can be subjected to at least one further heat treatment.

The superconducting material or the heat-treated high-temperature superconducting material comprises at least one of the superconducting phases having a composition based essentially on (Bi,Pb)—Ae—Cu—O, (Y,RE)—Ae—Cu—O or (Tl,Pb)—(Ae,Y)—Cu—O, where Ae designates alkaline earth elements and in particular Ba, Ca or/and Sr. Here, the phases which occur have, in particular, a composition of approximately $(Bi,Pb)_2(Sr,Ca)_2Cu_1O_{x'}$, $(Bi,Pb)_2(Sr,Ca)_3Cu_2O_{x''}$, $(Bi,Pb)_2(Sr,Ca)_4Cu_3O_{x'''}$, $(Y,SE)_1Ba_2Cu_3O_{y'}$, $(Y,SE)_2Ba_1Cu_1O_{y''}$, $(Tl,Pb)_2(Ba,Ca)_2Cu_1O_{z'}$, $(Tl,Pb)_2(Ca,Ba)_3Cu_2O_{z''}$, $(Tl,Pb)_2(Ca,Ba)_4Cu_3O_{z'''}$, $(Tl,Pb)_1(Ca,Ba)_3Cu_2O_{z''''}$, $(Tl,Pb)_1(Ca,Ba)_4Cu_3O_{z'''''}$. In some cases it is advisable to mix sulfate(s) into the starting powder mixture, the superconducting material or the heat treated high-temperature superconducting material so that alkaline earth metal sulfates, in particular $BaSO_4$, $SrSO_4$ or/and $(Ba,Sr)SO_4$, are present in addition to the superconducting phase(s).

If the superconducting shaped body of the invention has been subjected to only moderate heat treatment, its predominantly platelet-shaped primary particles have grown compared to those of the pressed shaped body and are partly sintered together and, at least in part of the outer wall, are aligned essentially perpendicular to the pressing direction of the isostatic compaction step.

If the superconducting shaped body of the invention has been strongly heat-treated, its microstructure is strongly sintered together and, at least in part of the outer wall, is aligned essentially perpendicular to the pressing direction of the isostatic compaction step.

The shaped body of the invention can be used as a blank, preferably for the production of high-temperature superconducting wires, strips, rods, tubes, hollow or solid bodies, in particular for producing high current cables, transformers, windings, magnets, magnetic bearings or power leads.

FIGURES

FIG. 2 shows a schematic diagram of a tool block of an isostatic press using the dry bag method with bag and charge of material to be pressed.

EXAMPLES

Figure 1:
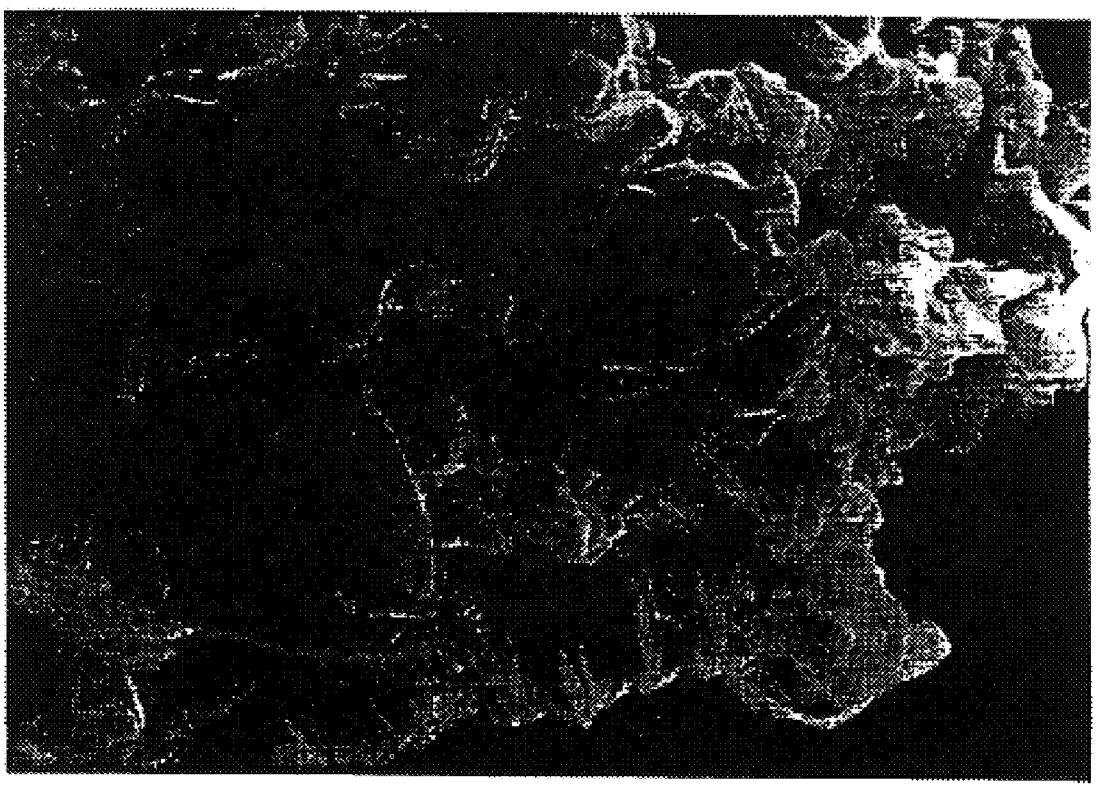
FIG. 1 shows a scanning electron micrograph of an oxidic starting powder based on (Bi,Pb)—Ae—Cu—O before milling as described in claim 1.

The invention is illustrated by means of the following comparative example and the examples according to the invention:

Comparative Example 1:

A powder having the composition $Bi_{1.7}Pb_{0.33}Sr_{1.88}Ca_{1.96}Cu_3O_x$ was synthesized without comminution in a plurality of heat treatment steps over a total of 20 hours at 790° C. until it had been converted into the two-layer material, with the high-temperature superconducting phase BSCCO 2212 accompanied by certain amounts of copper oxide and alkaline earth metal cuprates being present. The material obtained in this way had a carbon content of 200 ppm and a nitrogen content of 100 ppm. The platelet-shaped primary particles mostly had a thickness of from 0.3 to 0.5 µm and a length of from 1 to 8 µm, as determined on fracture surfaces under a scanning electron microscope. The mean size of the particles, which were mostly present in the form of agglomerates and aggregates, was about 20 µm; it was reduced to 13 µm by treatment with ultrasound from an ultrasonic probe for fifteen minutes in the preparation of the suspension for determination of the particle size distribution by means of a laser granulometer Master Sizer XSB.OD from Malvern Instruments. The powder was, without comminution or granulation being carried out after heat treatment, isostatically pressed at 2500 bar by the wet bag method to produce cylinders having a diameter of 12±2 mm and a length of 110 mm. The shape deviation of the compacts for further processing was so great that the shaped body could be introduced into a silver sheathing tube and had the required accuracy of fit of at most ±0.2 mm diameter fluctuation only after mechanical shaping by turning. The density of the compacts was 4.3 g/cm³, which corresponds to a relative density of about 68%. The intact, hard aggregates can be recognized by means of a scanning electron microscope even after pressing. No noticeable alignment of the particles was visible under the scanning electron microscope. The particles were therefore not oriented essentially in the direction of the future current flow.

Example 1:

The starting powder of Comparative Example 1 was used and dry milled for 60 minutes to a mean particle size of 4 µm in a vibration mill model M18 from SWECO Europe. In all the examples according to the invention, the particle size distribution was determined using the laser granulometer without ultrasound treatment. The milled material was isostatically pressed at 2000 bar by the dry bag method in a tool corresponding to FIG. 1 under conditions otherwise identical to those in the comparative example to produce shaped bodies having a diameter of 12±0.2 mm and a length of 110 mm. The diameter tolerance of +0.2 mm could be easily achieved in a large number of specimens. The green density was 4.5 g/cm³, which corresponds to a relative density of about 71%. Aggregates could no longer be recognized on fracture surfaces of the pressed shaped bodies (=blanks) using a scanning electron microscope. The platelet texture in the axial direction was very pronounced.

Example 2:

The starting powder of Comparative Example 1 was used and dry milled to a mean particle size of 2.5 µm in a laboratory jet mill model MC100KXBD from Crispo AG at a throughput of 500 g/h and one pass through the mill. The milled material was isostatically pressed by the dry bag method under the same conditions as in Example 1 to produce shaped bodies having the same dimensions as in Example 1. Their green density was 4.45 g/cm³, which corresponds to a relative density of about 70%. Aggregates could no longer be recognized on fracture surfaces of pressed shaped bodies under a scanning electron microscope. The platelet texture in the axial direction was clearly pronounced.

Example 3:

A powder mixture having the composition $Bi_{1.9}Sr_{2.11}Ca_{0.9}Cu_2O_y$ was homogeneously melted at a temperature of about 1000° C. The melt was poured into a mold. After cooling to room temperature, the solid was comminuted roughly. This powder was dry milled to a mean particle size of 3 µm in a milling and screening unit model 100AFG from Hosokawa-Alpine AG, subjected to intermediate heat treatment to further reduce the carbon content which had been increased during milling and isostatically pressed at 2000 bar using the dry bag method to produce prismatic shaped bodies having dimensions of $9^{-0.2}$ mm×$9^{-0.2}$ mm×100 mm. The density was 4.7 g/cm³, which corresponds to a relative density of about 71%. Examination under a scanning electron microscope indicated excellent texture in the axial direction.

Example 4:

The procedure of Example 1 was repeated under the same conditions, except that 0.01% of an organic liquid in the form of a solvent-free acid was added to the starting powder. The same results as in Example 1 were obtained, although the milled powder was granular and free-flowing so that it was well suited to pressing using automatic charging, metering and pressing.

What is claimed is:

1. A process for producing a shaped body, in which a mixture of oxidic starting powders or a superconducting material, which comprises at least 30% by volume of platelet-shaped primary particles and has such a composition that a high-temperature superconducting material is formed on later, suitable thermal treatment, is comminuted by milling, shearing or rolling in such a way that the comminuted power has a powder particle size distribution having a $d_{90}$ of $\leq 20$ µm, and in which the powders which have been comminuted in this way are isostatically compacted only by radial pressure by the dry bag method.

2. The process of as claimed in claim 1, wherein the starting powder mixture or the superconducting material is comminuted in such a way that at most 90% by volume of the powder particles are present in platelet form for isotatic pressing.

3. The process of as claimed in claim 1, wherein the starting powder mixture or the superconducting material is comminuted using a vibration mill, a jet mill or shear rollers.

4. The process as claimed in claim 1, wherein the starting powder mixture or the superconducting material is thermally treated before or after comminution so that the proportion of platelet-shaped primary particles is increased in the range to at least 40% by volume.

5. The process as claimed in claim 4, wherein the proportion is increased to at least 60% by volume.

6. The process as claimed in claim 5, wherein the proportion is increased to at least 75% by volume.

7. The process as claimed in claim 1, wherein organic auxiliaries are added to the starting powder mixture or the superconducting material and comminution in the dry or virtually dry state produces a free-flowing powder.

8. The process as claimed in claim 1, wherein the comminuted powder is shaped to produce essentially cylindrical, prismatic or tubular shaped bodies.

9. The process as claim in claim 8, wherein at least one elongated metal body is embedded in the shaped body during shaping.

10. The process as claimed in claim 9, wherein the elongated metal body is embedded as a core in the longitudinal direction in the region of or around the longitudinal axis of the shaped body.

11. The process as claimed in claim 9, wherein the longitudinal body or the tubular shaped body consists essentially of at least one metal or at least one alloy and comprises silver.

12. The process as claimed in claim 8, wherein the shaped body is introduced into a tube having an essentially cylindrical or prismatic shape, including a metallic tube closed at one end.

13. The process as claimed in claim 1, wherein the comminuted powders are shaped to produce longitudinal shaped bodies having a ratio of length to external diameter or of length to greatest thickness of at least 2:1, in particular at least 4:1.

14. The process as claimed in claim 13, wherein the shaped body is further processed by single or repeated extrusion or rolling to produce a monofilament and, if desired, by bundling together a plurality of monofilaments and possibly additionally by single or repeated extrusion or rolling to produce a multifilament.

15. The process as claimed in claim 14, wherein the shaped body, the tube filled with the shaped body/bodies or the further processed shaped body is heat-treated at temperatures of from 400 to 1100° C.

16. The process as claimed in claim 15, wherein the shaped body, the tube filled with the shaped body/bodies or the further processed shaped body is heat-treated by means of at least one intermediate or subsequent thermal treatment.

17. The process as claimed in claim 16, wherein the shaped body, the tube filled with the shaped body/bodies or the further processed shaped body is alternately heat-treated and rolled a plurality of times.

18. The process as claimed in claim 17, wherein the superconducting material or the heat-treated high-temperature superconducting material comprises at least one of the superconducting phases having a composition based on $(Bi,Pb)$—$Ae$—$Cu$—$O$, $(Y,RE)$—$Ae$—$CU$—$O$ or $(Tl,Pb)$—$(Ae,Y)$—$Cu$—$O$, where Ae designates alkaline earth elements, Ba, Ca or Sr.

19. The process as claimed in claim 18, wherein sulfate(s) is/are mixed into the starting powder mixture, the superconducting material or the heat-treated high-temperature superconducting material so that not only the superconducting phase(s) but also alkaline earth metal sulfates, of $BaSO_4$, $SrSO_4$, or $(Ba,Sr)SO_4$, are obtained.

20. The process as claimed in claim 1, wherein a multiple tool is used for isostatic compaction.

21. The process as claimed in claim 1, wherein the thermal treatment includes baking out, burning out or chemical desorption to remove organic auxiliaries.

* * * * *